US012769486B2

(12) United States Patent
Vogelsang et al.

(10) Patent No.: US 12,769,486 B2

(45) Date of Patent: Oct. 20, 2026

(54) STACKED DEVICE COMMUNICATION

(71) Applicant: Rambus Inc., San Jose, CA (US)

(72) Inventors: Thomas Vogelsang, Jericho, VT (US); Michael Raymond Miller, Raleigh, NC (US); Steven C. Woo, Saratoga, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 19/232,570

(22) Filed: Jun. 9, 2025

(65) Prior Publication Data

US 2025/0362834 A1 Nov. 27, 2025

Related U.S. Application Data

(63) Continuation of application No. 18/427,191, filed on Jan. 30, 2024, now Pat. No. 12,346,604, which is a continuation of application No. 17/576,529, filed on Jan. 14, 2022, now Pat. No. 11,922,066.

(60) Provisional application No. 63/140,165, filed on Jan. 21, 2021.

(51) Int. Cl.

*G06F 3/06* (2006.01)
*G11C 7/10* (2006.01)

(52) U.S. Cl.

CPC .......... *G06F 3/0659* (2013.01); *G06F 3/0626* (2013.01); *G06F 3/0658* (2013.01); *G06F 3/0673* (2013.01); *G11C 7/1006* (2013.01)

(58) Field of Classification Search

CPC .... G06F 3/0659; G06F 3/0626; G06F 3/0658; G06F 3/0673

See application file for complete search history.

(56) References Cited

U.S. PATENT DOCUMENTS

2003/0035312 A1* 2/2003 Halbert .................... G11C 8/12 365/51
2014/0006699 A1 1/2014 Bains et al.
2015/0106574 A1 4/2015 Jayasena et al.
2015/0255131 A1 9/2015 Byeon et al.
2015/0277790 A1 10/2015 Mozak et al.
2017/0060790 A1 3/2017 Bialas, Jr. et al.
2017/0091040 A1 3/2017 Wright et al.
2017/0255390 A1 9/2017 Chang et al.
2020/0035291 A1 1/2020 Kasibhatla et al.

(Continued)

*Primary Examiner* — Tracy A Warren

(74) *Attorney, Agent, or Firm* — The Neudeck Law Firm, LLC

(57) ABSTRACT

An interconnected stack of one or more Dynamic Random Access Memory (DRAM) die has a base logic die and one or more custom logic or processor die. The processor logic die snoops commands sent to and through the stack. In particular, the processor logic die may snoop mode setting commands (e.g., mode register set—MRS commands). At least one mode setting command that is ignored by the DRAM in the stack is used to communicate a command to the processor logic die. In response the processor logic die may prevent commands, addresses, and data from reaching the DRAM die(s). This enables the processor logic die to send commands/addresses and communicate data with the DRAM die(s). While being able to send commands/addresses and communicate data with the DRAM die(s), the processor logic die may execute software using the DRAM die(s) for program and/or data storage and retrieval.

20 Claims, 12 Drawing Sheets

(56) References Cited

U.S. PATENT DOCUMENTS

| | | | | |
|---|---|---|---|---|
| 2020/0341775 | A1 | 10/2020 | Mathew et al. | |
| 2020/0356305 | A1 | 11/2020 | Kim et al. | |
| 2022/0197829 | A1 * | 6/2022 | Gomes | G06F 12/0238 |

* cited by examiner

STACKED DEVICE COMMUNICATION

DETAILED DESCRIPTION OF THE EMBODIMENTS

In an embodiment, an interconnected stack of one or more Dynamic Random Access Memory (DRAM) die has a base logic die and one or more custom logic or processor die. The processor die may be placed in the stack as the top die, the bottom die, and/or between the base logic die and the DRAM die(s). When the processor die is the top die or is between the base logic die and the DRAM die(s), the processor die is interconnected vertically with the DRAM die(s) and the base logic die via shared through-silicon via (TSV) connections that carry data and control signals throughout the stack. When the processor die is the bottom die, the processor die is interconnected with the base logic die via the external ballout of the base logic die and the base logic die is interconnected vertically with the DRAM die(s) via shared through-silicon via (TSV) connections that carry data and control signals throughout the DRAM and logic die stack.

In an embodiment, the processor logic die snoops commands sent to and through the stack. In particular, the processor logic die may snoop mode setting commands (e.g., mode register set—MRS commands). At least one mode setting command that is ignored by the DRAM in the stack is used to communicate a command to the processor logic die. In response the processor logic die may prevent commands, addresses, and data from reaching the DRAM die(s). This enables the processor logic die to send commands/addresses and communicate data with the DRAM die(s). While being able to send commands/addresses and communicate data with the DRAM die(s), the processor logic die may execute software using the DRAM die(s) for program and/or data storage and retrieval.

Figure 1A:
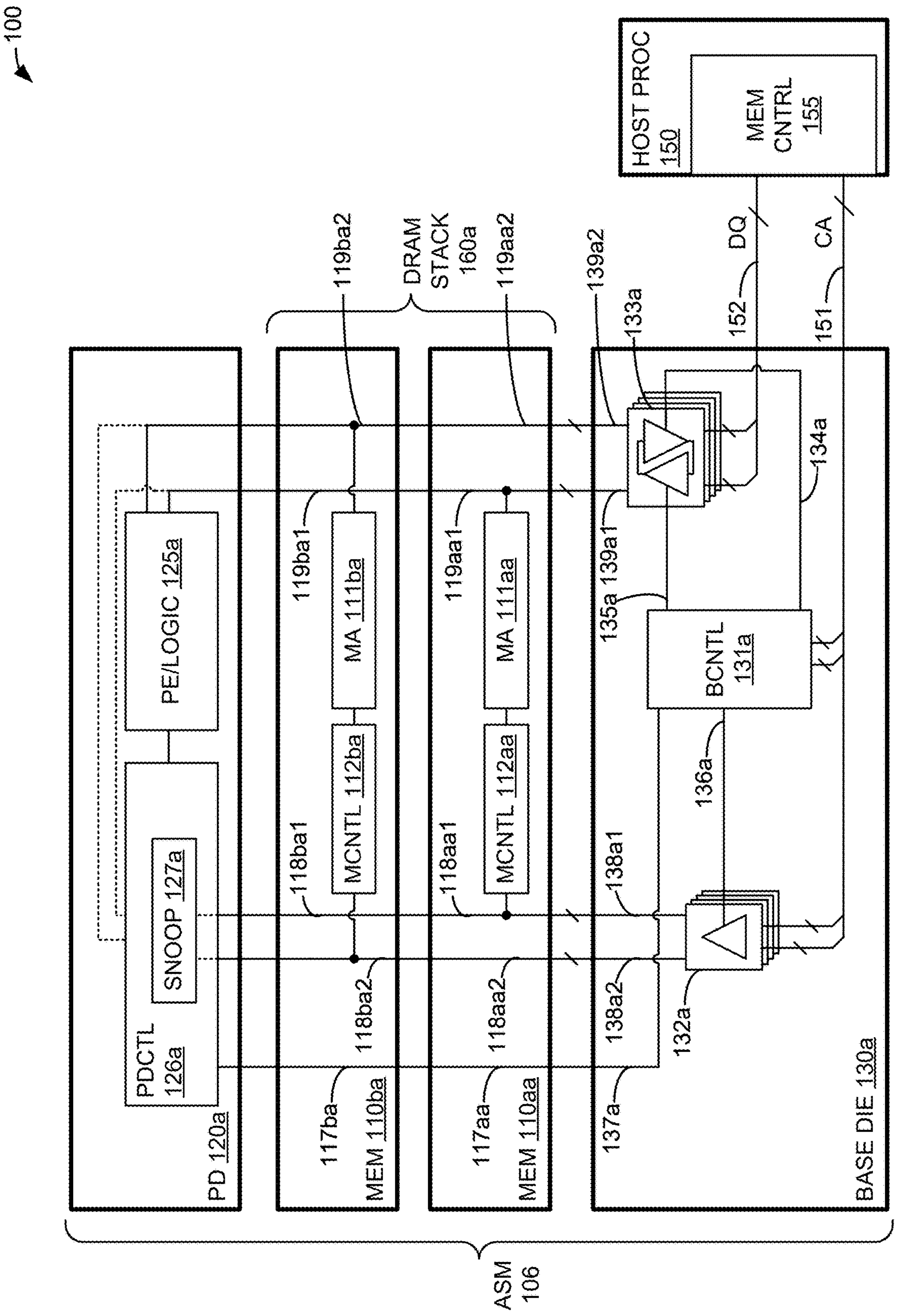
FIGS. 1A-1C are a block diagrams illustrating stacked device communication.
Figure 1B:
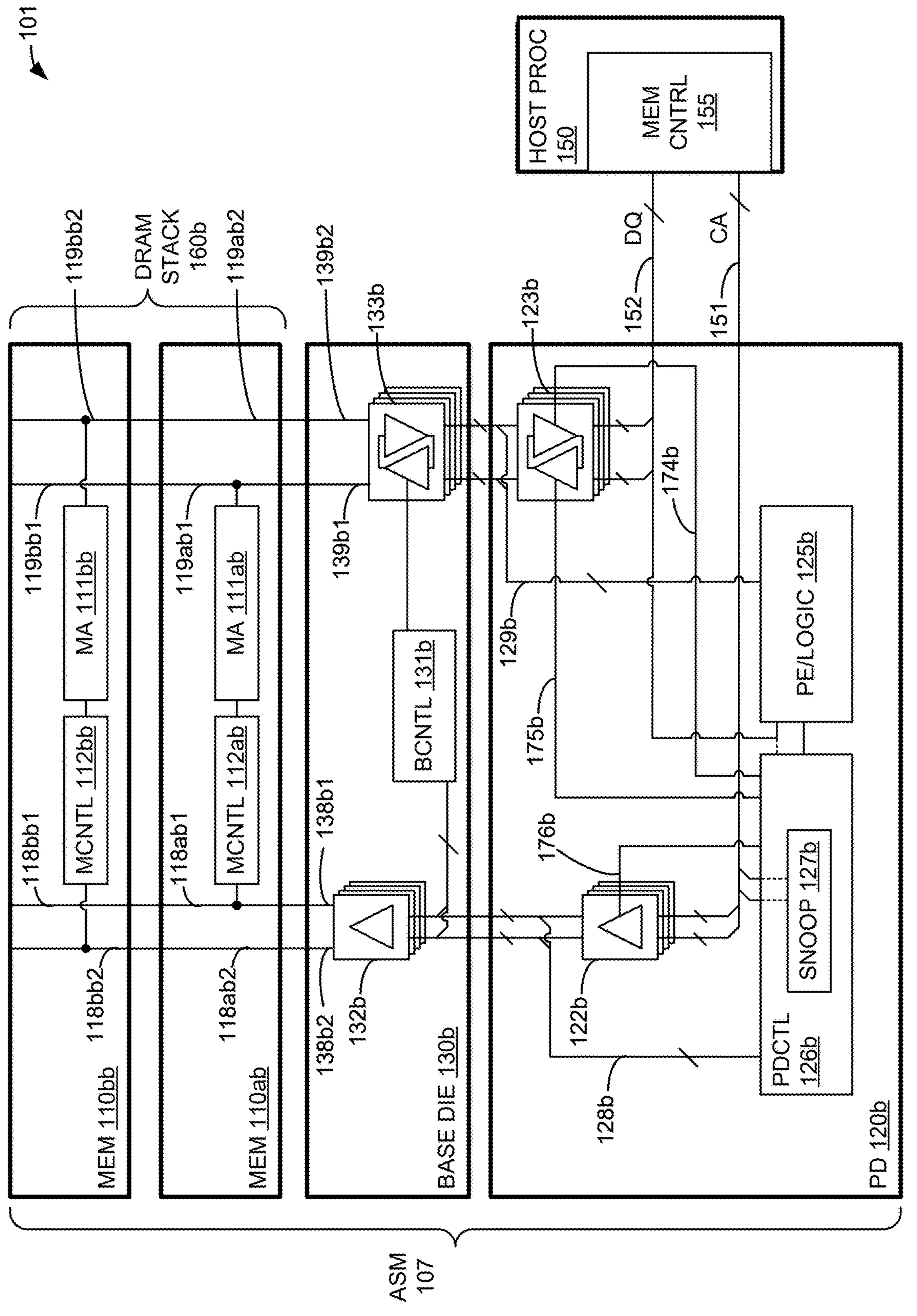
Figure 1C:
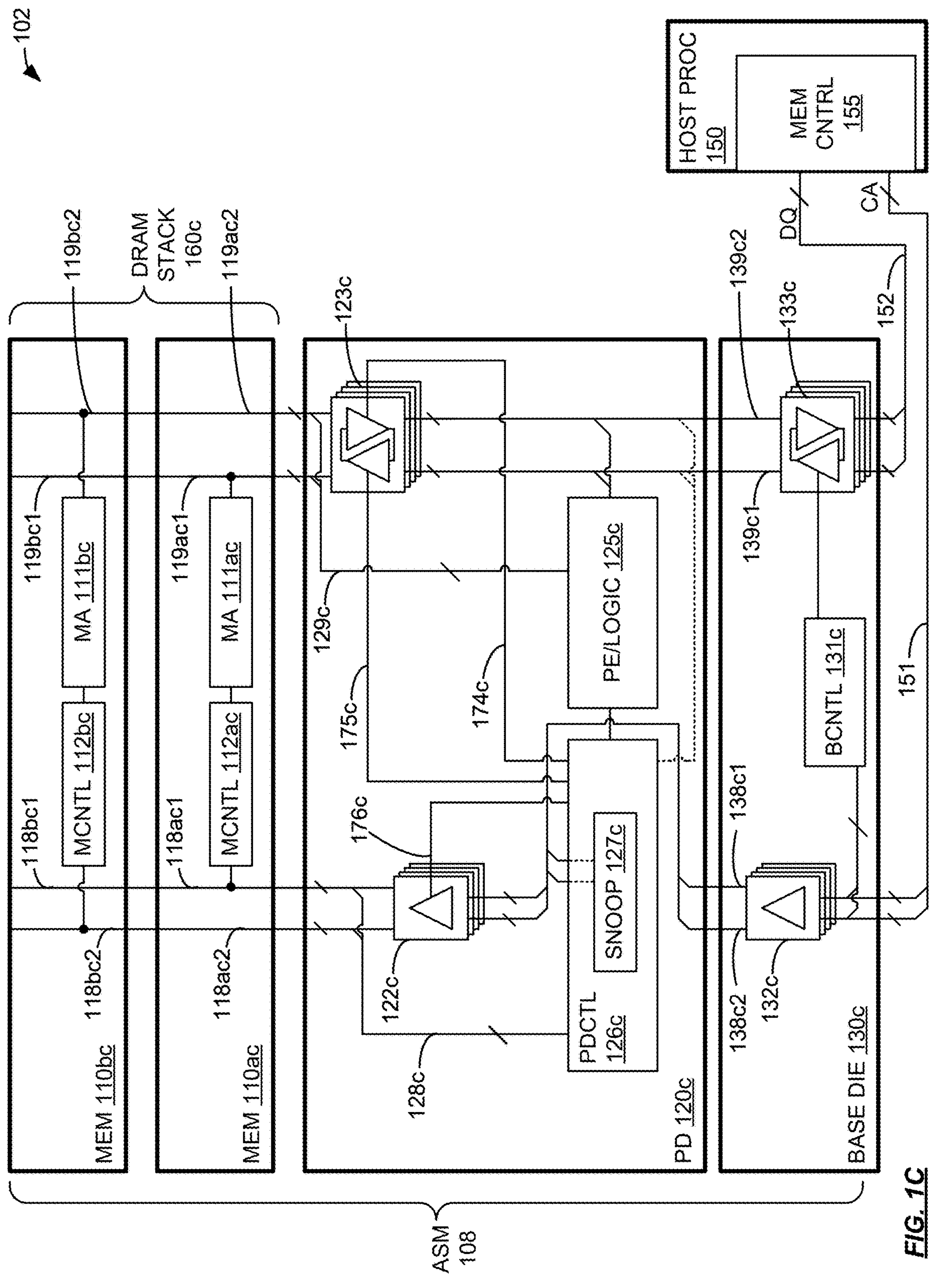

FIGS. 1A-1C are a block diagrams illustrating stacked device communication. FIG. 1A illustrates a stack of DRAM die(s), a base die, and a processor/logic die with the processor/logic die on the top of the stack. In FIG. 1A, system 100 comprises assembly 106 and host processor 150. Host processor 150 includes memory controller 155. Assembly 106 includes base die 130*a* (a.k.a. base logic die), memory devices 110*aa*-110*ba*, and processor/logic die 120*a* (hereinafter processor die 120*a*). Base die 130*a* is the bottom die of the stack. Memory device 110*aa* is stacked on top of base die 130*a*. Memory device 110*ba* is stacked on top of memory device 110*aa*. In FIG. 1A, memory device 110*aa* and memory device 110*ba* form DRAM stack 160*a*. It should be understood that the two stacked memory devices 110*aa*-110*ba* in DRAM stack 160*a* is merely for illustration purposes. Any number of memory devices 110*aa*-110*ba* may be stacked to form DRAM stack 160*a*. Processor die 120*a* is stacked on top of memory device 110*ba*.

A memory controller, such as memory controller 155, manages the flow of data going to and from memory devices and/or memory modules. A memory controller can be a separate, standalone chip, or integrated into another chip. For example, a memory controller may be included on a single die with a microprocessor, or included as part of a more complex integrated circuit system such as a block of a system on a chip (SOC).

Memory device 110*aa* includes memory array 111*aa*, memory control 112*aa*, command/address (CA) TSV connections 118*aa*1-118*aa*2, data (DQ) TSV connections 119*aa*1-119*aa*2, and side-channel TSV connections 117*aa*. Memory control 112*aa* is operatively coupled to TSV connections 118*aa*1 and memory array 111*aa*. Memory array 111*aa* is operatively coupled to TSV connections 119*aa*1. TSV connections 118*aa*1 of memory device 110*aa* are connected to TSV connection 118*ba*1 of memory device 110*ba*. TSV connections 118*aa*2 of memory device 110*aa* are connected to TSV connection 118*ba*2 of memory device 110*ba*. TSV connections 119*aa*1 of memory device 110*aa* are connected to TSV connection 119*ba*1 of memory device 110*ba*. TSV connections 119*aa*2 of memory device 110*aa* are connected to TSV connection 119*ba*2 of memory device 110*ba*. TSV connections 117*aa* of memory device 110*aa* are connected to TSV connection 117*ba* of memory device 110*ba*.

Memory device 110*ba* includes memory array 111*ba*, memory control 112*ba*, command/address (CA) TSV connections 118*ba*1-118*ba*2, data (DQ) TSV connections 119*ba*1-119*ba*2, and side-channel TSV connections 117*ba*. Memory control 112*ba* is operatively coupled to TSV connections 118*ba*2 and memory array 111*ba*. Memory array 111*ba* is operatively coupled to TSV connections 119*ba*2.

TSV connections 118*aa*1-118*aa*2 118*ba*1-118*ba*2 119*aa*1-119*aa*2 119*ba*1-119*ba*2 may be organized into one or more sets of TSV connections (e.g., a first set including TSV connections 118*aa*1, 118*ba*1, 119*aa*1, 119*ba*1 and a second set including 118*aa*2, 118*ba*2, 119*aa*2, 119*ba*2, etc.) that are also known as channels. Channels each include CA and DQ signals and operate independent of each other. A given channel can be shared between memory devices 110*aa*-110*ba* or, as illustrated in FIG. 1A, be shared only by a subset of memory devices in the assembly 106. Processor die 120*a* and base die 130*a* connect to all channels. In an embodiment, the sets of TSV connections are compatible with high-bandwidth memory (HBM) stacks. Thus, for example, the TSV connections 138*a*1-138*a*2 139*a*1-139*a*2 from base die 130*a* may be organized into eight channels, with each memory device 110*aa*-110*ba* connecting to two channels. This results in a DRAM stack 160*a* having a number of memory devices 110*aa*-11*ba* that is a multiple of four.

Processor die 120*a* includes processor element and/or logic 125*a* (hereinafter processor element 125*a*), and processor die control 126*a*. Processor die control 126*a* includes command/address snooping circuitry 127*a*. Processor die control 126*a* may include a memory controller (not shown in FIG. 1A). Processor die control 126*a* is operatively coupled to processor element 125*a*. Processor element 125*a* is operatively coupled to TSV connections 119*ba*1-119*ba*2 of memory device 110*ba*. Processor die control 126*a* is operatively coupled to TSV connections 118*ba*1-118*ba*2. Processor die control 126*a* is operatively coupled to TSV connections 117_ba_ of memory device 110_ba_. Processor die control 126_a_ is, in some embodiments, operatively coupled to TSV connections 119_ba_1-119_ba_2 of memory device 110_ba_.

Base die 130_a_ includes base die control 131_a_, command/address (CA) buffers 132_a_, data (DQ) buffers 133_a_, TSV connections 137_a_, TSV connections 138_a_1-138_a_2, and TSV connections 139_a_1-139_a_2. Base die 130_a_ (and base die control 131_a_, in particular) receives CA signals 151 from memory controller 155. Base die 130_a_ bidirectionally communicates DQ signals 152 with memory controller 155.

TSV connections 138_a_1 of base die 130_a_ are connected to TSV connections 118_aa_1 of memory device 110_aa_. TSV connections 138_a_2 of base die 130_a_ are connected to TSV connections 118_aa_2 of memory device 110_aa_. TSV connections 139_a_1 of base die 130_a_ are connected to TSV connections 119_aa_1 of memory device 110_aa_. TSV connections 139_a_2 of base die 130_a_ are connected to TSV connections 119_aa_2 of memory device 110_aa_. TSV connections 137_a_ of base die 130_a_ are connected to TSV connections 117_aa_ of memory device 110_aa_. TSV connections 117_aa_ of memory device 110_aa_ are connected to TSV connections 117_ba_ of memory device 110_ba_. TSV connections 117_ba_ of memory device 110_ba_ are operatively coupled to processor die control 126_a_.

TSV connections 118_aa_1 of memory device 110_aa_ are connected to TSV connection 118_ba_1 of memory device 110_ba_. TSV connections 118_aa_2 of memory device 110_aa_ are connected to TSV connection 118_bb_2 of memory device 110_ba_. TSV connections 119_aa_1 of memory device 110_aa_ are connected to TSV connection 119_ba_1 of memory device 110_ba_. TSV connections 119_aa_2 of memory device 110_aa_ are connected to TSV connection 119_ba_2 of memory device 110_ba_. TSV connections 118_ba_1-118_ba_2 of memory device 110_ba_ are operatively coupled to processor die control 126_a_, and snoop circuitry 127_a_, in particular. TSV connections 119_ba_1-119_ba_2 of memory device 110_ba_ are operatively coupled to processor element 125_a_.

The inputs to CA buffers 132_a_ are operatively coupled to receive CA signals 151 from memory controller 155. CA buffers 132_a_, under the control of signal 136_a_ from base die control 131_a_, selectively drive CA signals 151 on TSV connections 138_a_1-138_a_2, or block CA signals 151 from being driven on TSV connections 138_a_1-138_a_2. In an embodiment, CA buffers 132_a_ are tri-state buffers. Thus, when CA buffers 132_a_ are preventing CA signals 151 from being driven on TSV connections 138_a_1-138_a_2, the outputs of CA buffers 132_a_ are in a high-impedance (a.k.a., tri-stated) state effectively removing the outputs of CA buffers 132_a_ from being connected to TSV connections 138_a_1-138_a_2. From the foregoing, it should be understood that CA signals driven by CA buffers 132_a_ onto TSV connections 138_a_1-138_a_2 are received by memory device 110_aa_, memory device 110_ba_, and processor die control 126_a_ via one or more of TSV connections 118_aa_1-118_aa_2 and TSV connections 118_ba_1-118_ba_2.

Bidirectional DQ buffers 133_a_ are operatively coupled to communicate DQ signals 152 between TSV connections 139_a_1-139_a_2 and memory controller 155. DQ buffers 133_a_, under the control of signals 134_a_-135_a_, selectively drive DQ signals 152 onto TSV connections 139_a_1-139_a_2, selectively drive the signals on TSV connections 139_a_1-139_a_2 onto DQ signals 152, or isolate TSV connections 139_a_1-139_a_2 from DQ signals 152, and vice versa. From the foregoing, it should be understood that DQ signals relayed by DQ buffers 133_a_ onto or from TSV connections 139_a_1-139_a_2 are communicated with memory device 110_aa_, memory device 110_ba_, and processor die control 126_a_ via one or more of TSV connections 119_aa_1-119_a_2 and TSV connections 119_ba_1-119_ba_2.

Based on CA command information received by processor die control 126_a_, and snoop circuitry 127_a_, in particular, processor die control 126_a_ may signal base die control 131_a_ via TSV connections 117_ba_, TSV connections 117_aa_, and TSV connections 137_a_ to selectively isolate and not isolate memory devices 110_aa_-110_ba_ from memory controller 155. For example, in response to one or more mode register setting commands (e.g., a MRS command that memory devices 110_aa_-110_ba_ do not respond to) on CA signals 151 that is relayed to processor die 120_a_ and detected by snoop circuitry 127_a_, processor die control 126_a_ may signal base die control 131_a_ to isolate memory devices 110_aa_-110_ba_ from CA signals 151 and DQ signals 152. In another example, in response to a timer, or an indicator from processor element 125_a_, processor die control 126_a_ may signal base die control 131_a_ to re-couple memory devices 110_aa_-110_ba_ to CA signals 151 and DQ signals 152.

FIG. 1B illustrates a stack of DRAM die(s), a base die, and a processor/logic die with the processor/logic die on the bottom of the stack. In FIG. 1B, system 101 comprises assembly 107 and host processor 150. Host processor 150 includes memory controller 155. Assembly 107 includes base die 130_b_ (a.k.a. base logic die), memory devices 110_ab_-110_bb_, and processor/logic die 120_b_ (hereinafter processor die 120_b_). Processor die 120_b_ is the bottom die of the stack. Base die 130_b_ is stacked on top of processor die 120_b_. Memory device 110_ab_ is stacked on top of base die 130_b_. Memory device 110_bb_ is stacked on top of memory device 110_ab_. In FIG. 1B, memory device 110_ab_ and memory device 110_bb_ form DRAM stack 160_b_. It should be understood that the two stacked memory devices 110_ab_-110_bb_ in DRAM stack 160_b_ is merely for illustration purposes. Any number of memory devices 110_ab_-110_bb_ may be stacked to form DRAM stack 160_b_.

Memory device 110_ab_ includes memory array 111_ab_, memory control 112_ab_, command/address (CA) TSV connections 118_ab_1-118_ab_2, and data (DQ) TSV connections 119_ab_1-119_ab_2. Memory control 112_ab_ is operatively coupled to TSV connections 118_ab_1 and memory array 111_ab_. Memory array 111_ab_ is operatively coupled to TSV connections 119_ab_1. TSV connections 118_ab_1 of memory device 110_ab_ are connected to TSV connection 118_bb_1 of memory device 110_bb_. TSV connections 118_ab_2 of memory device 110_ab_ are connected to TSV connection 118_bb_2 of memory device 110_bb_. TSV connections 119_ab_1 of memory device 110_ab_ are connected to TSV connection 119_bb_1 of memory device 110_bb_. TSV connections 119_ab_2 of memory device 110_ab_ are connected to TSV connection 119_bb_2 of memory device 110_bb_.

Memory device 110_bb_ includes memory array 111_bb_, memory control 112_bb_, command/address (CA) TSV connections 118_bb_1-118_bb_2, data (DQ) TSV connections 119_bb_1-119_bb_2. Memory control 112_bb_ is operatively coupled to TSV connections 118_bb_2 and memory array 111_bb_. Memory array 111_bb_ is operatively coupled to TSV connections 119_bb_2.

TSV connections 118_ab_1-118_ab_2 118_bb_1-118_bb_2 119_ab_1-119_ab_2 119_bb_1-119_bb_2 may be organized into one or more sets of TSV connections (e.g., a first set including TSV connections 118_ab_1, 118_bb_1, 119_ab_1, 119_bb_1 and a second set including 118_ab_2, 118_bb_2, 119_ab_2, 119_bb_2, etc.) known as channels. Channels each include CA and DQ signals and operate independent of each other. A given channel can be shared between memory devices 110_ab_-

110*bb* or, as illustrated in FIG. 1B, be shared only by a subset of memory devices in the assembly 107. Processor die 120*b* and base die 130*b* connect to all channels. In an embodiment, the sets of TSV connections are compatible with high-bandwidth memory (HBM) stacks. Thus, for example, the TSV connections 138*b*1-138*b*2 139*b*1-139*b*2 from base die 130*b* may be organized into eight channels, with each memory device 110*ab*-110*bb* connecting to two channels. This results in a DRAM stack 160*b* having a number of memory devices 110*ab*-11*bb* that is a multiple of four.

Processor die 120*b* includes CA buffers 122*b*, DQ buffers 123*b*, processor element and/or logic 125*b* (hereinafter processor element 125*b*), processor die control 126*b*, ballout connections 128*b*, ballout connections 129*b*, and buffer control signals 174*b*-176*b*. Processor die 120*b* receives CA signals 151 from memory controller 155. Processor die 120*b* bidirectionally communicates DQ signals 152 with memory controller 155.

Base die 130*b* includes base die control 131*b*, command/address (CA) buffers 132*b*, data (DQ) buffers 133*b*, TSV connections 138*b*1-138*b*2, and TSV connections 139*b*1-139*b*2. Base die 130*b* (and base die control 131*b*, in particular) receives CA signals via ballout connections 128*b*. Base die 130*b* bidirectionally communicates DQ signals via ballout connections 129*b*.

TSV connections 138*b*1-138*b*2 of base die 130*b* are respectively connected to TSV connections 118*ab*1-118*ab*2 of memory device 110*ab*. TSV connections 139*b*1-139*b*2 of base die 130*b* are respectively connected to TSV connections 119*ab*1-119*ab*2 of memory device 110*ab*.

Processor die control 126*b* includes command/address snooping circuitry 127*b*. Processor die control 126*b* includes a memory controller (not shown in FIG. 1B). Processor die control 126*b* is operatively coupled to CA buffers 122*b* via control signal 176*b*. Processor die control 126*b* is operatively coupled to DQ buffers 123*b* via control signals 174*b*-175*b*. Processor die control 126*b* is operatively coupled to processor element 125*b*. Processor element 125*b* is operatively coupled to DQ signals 152 of memory controller 155. Processor die control 126*a* is operatively coupled to CA signals 151 of memory controller 155. Processor die control 126*b* is, in some embodiments, operatively coupled to DQ signals 152 of memory controller 155.

Ballout connections 128*b* of processor die 120*b* are connected to ballout connections of base die 130*b*. Ballout connections 129*b* of processor die 120*b* are connected to ballout connections of base die 130*b*. Thus, it should be understood that base die 130*b* and DRAM stack 160*b* may compose an unmodified high-bandwidth memory (HBM) stack connected to processor die 120*b* using a standardized ballout configuration.

The inputs to CA buffers 122*b* are operatively coupled to receive CA signals 151 from memory controller 155. CA buffers 122*b*, under the control of control signal 176*b* from processor die control 126*b*, selectively drive CA signals 151 on ballout connections 128*b*, or block CA signals 151 from being driven on ballout connections 128*b*. When CA signals 151 are blocked from being driven on ballout connections 128*b*, processor die control 126*b* may drive CA signals onto ballout connections 128*b*. From the foregoing, it should be understood that CA signals driven by CA buffers 122*b* or processor die control 126*b* onto ballout connections 128*b* are received by base die 130*b*, memory device 110*ab*, and memory device 110*bb*, via one or more of ballout connections 128*b*, TSV connections 118*ab*1-118*ab*2 and TSV connections 118*bb*1-118*bb*2.

Bidirectional DQ buffers 123*b* are operatively coupled to communicate DQ signals 152 between ballout connections 129*b* and memory controller 155. DQ buffers 123*b*, under the control of signals 174*b*-175*b*, selectively drive DQ signals 152 onto ballout connections 129*b*, and selectively drive the signals on ballout connections 129*b* onto DQ signals 152. When DQ signals 152 are not being driven on ballout connections 129*b*, processor element 125*b* (and/or processor die control 126*b*—not shown in FIG. 1B) may drive or receive DQ signals onto or from, respectively, ballout connections 129*b*. From the foregoing, it should be understood that DQ signals relayed by DQ buffers 123*ba* onto or from ballout connections 129*b* are communicated with base die 130*b*, memory device 110*ab*, and memory device 110*bb*, via one or more of ballout connections 129*b*, TSV connections 119*ab*1-119*ab*2, and TSV connections 119*bb*1-119*bb*2.

Based on CA command information received by processor die control 126*b*, and snoop circuitry 127*b*, in particular, processor die control 126*b* may selectively isolate CA signals 151 and DQ signals 152 from memory devices 110*ab*-110*bb*. For example, in response to one or more mode register setting commands (e.g., a MRS command that memory devices 110*ab*-110*bb* do not respond to) on CA signals 151 that is detected by snoop circuitry 127*b*, processor die control 126*b* may use control signals 174*b*-176*b* to prevent CA signals 151 and DQ signals 152 from reaching ballout connections 128*b* and ballout connections 129*b*, respectively. In another example, in response to a timer, or an indicator from processor element 125*b*, processor die control 126*b* may use control signals 174*b*-176*b* to re-couple CA signals 151 and DQ signals 152 to ballout connections 128*b* and ballout connections 129*b*, respectively.

FIG. 1C illustrates a stack of DRAM die(s), a base die, and a processor/logic die with the processor/logic die between the base die and the memory device dies. In FIG. 1C, system 102 comprises assembly 108 and host processor 150. Host processor 150 includes memory controller 155. Assembly 108 includes base die 130*c* (a.k.a. base logic die), memory devices 110*ac*-110*bc*, and processor/logic die 120*c* (hereinafter processor die 120*c*). Base die 130*c* is the bottom die of the stack. Processor die 120*c* is stacked on top of base die 130*c*. Memory device 110*ac* is stacked on top of processor die 120*c*. Memory device 110*bc* is stacked on top of memory device 110*ac*. In FIG. 1C, memory device 110*ac* and memory device 110*bc* form DRAM stack 160*c*. It should be understood that the two stacked memory devices 110*ac*-110*bc* in DRAM stack 160*c* is merely for illustration purposes. Any number of memory devices 110*ac*-110*bc* may be stacked to form DRAM stack 160*c*.

Memory device 110*ac* includes memory array 111*ac*, memory control 112*ac*, command/address (CA) TSV connections 118*ac*1-118*ac*2, and data (DQ) TSV connections 119*ac*1-119*ac*2. Memory control 112*ac* is operatively coupled to TSV connections 118*ac*1 and memory array 111*ac*. Memory array 111*ac* is operatively coupled to TSV connections 119*ac*1. TSV connections 118*ac*1 of memory device 110*ac* are connected to TSV connection 118*bc*1 of memory device 110*bc*. TSV connections 118*ac*2 of memory device 110*ac* are connected to TSV connection 118*bc*2 of memory device 110*bc*. TSV connections 119*ac*1 of memory device 110*ac* are connected to TSV connection 119*bc*1 of memory device 110*bc*. TSV connections 119*ac*2 of memory device 110*ac* are connected to TSV connection 119*bc*2 of memory device 110*bc*.

Memory device 110*bc* includes memory array 111*bc*, memory control 112*bc*, command/address (CA) TSV connections 118*bc*1-118*bc*2, data (DQ) TSV connections 119*bc*1-119*bc*2. Memory control 112*bc* is operatively coupled to TSV connections 118*bc*2 and memory array 111*bc*. Memory array 111*bc* is operatively coupled to TSV connections 119*bc*2.

Base die 130*c* includes base die control 131*c*, command/address (CA) buffers 132*c*, data (DQ) buffers 133*c*, TSV connections 138*c*, and TSV connections 139*c*. Base die 130*c* (and base die control 131*c*, in particular) receives CA signals 151 from memory controller 155. Base die 130*c* bidirectionally communicates DQ signals 152 with memory controller 155.

TSV connections 118*ac*1-118*ac*2 118*bc*1-118*bc*2 119*ac*1-119*ac*2 119*bc*1-119*bc*2 may be organized into one or more sets of TSV connections (e.g., a first set including TSV connections 118*ac*1, 118*bc*1, 119*ac*1, 119*bc*1 and a second set including 118*ac*2, 118*bc*2, 119*ac*2, 119*bc*2, etc.) known as channels. Channels each include CA and DQ signals and operate independent of each other. A given channel can be shared between memory devices 110*ac*-110*bc* or, as illustrated in FIG. 1C, be shared only by a subset of memory devices in the assembly 108. Processor die 120*c* and base die 130*c* connect to all channels. In an embodiment, the sets of TSV connections are compatible with high-bandwidth memory (HBM) stacks. Thus, for example, the TSV connections 138*c*1-138*c*2 139*c*1-139*c*2 from base die 130*c* may be organized into eight channels, with each memory device 110*ac*-110*bc* connecting to two channels. This results in a DRAM stack 160*c* having a number of memory devices 110*ac*-110*bc* that is a multiple of four.

Processor die 120*c* includes CA buffers 122*c*, DQ buffers 123*c*, processor element and/or logic 125*c* (hereinafter processor element 125*c*), processor die control 126*c*, TSV connections 128*c*, TSV connections 129*c*, and buffer control signals 174*c*-176*c*. Processor die 120*c* receives CA signals from base die 130*c*. Processor die 120*b* bidirectionally communicates DQ signals with base die 130*c*.

TSV connections 138*c*1-138*c*2 of base die 130*c* are connected to processor die control 126*c* and the inputs of CA buffers 122*c*. TSV connections 139*c*1-139*c*2 of base die 130*c* are connected to DQ buffers 123*c*. TSV connections 128*c* of processor die 120*c* are connected to TSV connections 118*ac*1-118*ac*2 of memory device 110*ac*. TSV connections 129*c* of processor die 120*c* are connected to TSV connections 119*ac*1-119*ac*2 of memory device 110*ac*. TSV connections 118*ac*1-118*ac*2 of memory device 110*ac* are respectively connected to TSV connections 118*bc*1-118*bc*2 of memory device 110*bc*. TSV connections 119*ac*1-119*ac*2 of memory device 110*ac* are respectively connected to TSV connections 119*bc*1-119*bc*2 of memory device 110*bc*.

Processor die control 126*c* includes command/address snooping circuitry 127*c*. Processor die control 126*c* includes a memory controller (not shown in FIG. 1C). Processor die control 126*c* is operatively coupled to CA buffers 122*c* via control signal 176*c*. Processor die control 126*c* is operatively coupled to DQ buffers 123*c* via control signals 174*c*-175*c*. Processor die control 126*c* is operatively coupled to processor element 125*c*. Processor die control 126*c* is, in some embodiments, operatively coupled to DQ signals 152 of memory controller 155. Processor element 125*c* is operatively coupled to receive and drive DQ signals. Processor die control 126*c* is operatively coupled to receive and drive CA signals.

TSV connections 138*c*1-138*c*2 of base die 130*c* are connected to TSV connections of processor die 120*c*. TSV connections 139*c*1-139*c*2 of base die 130*c* are connected to TSV connections of processor die 120*c* and DQ buffers 123*c*, in particular.

The inputs to CA buffers 122*c* are operatively coupled to receive CA signals from base die 130*c*. CA buffers 122*c*, under the control of control signal 176*c* from processor die control 126*c*, selectively drive CA signals from base die 130*c* on TSV connections 128*c*, or block CA signals from base die 130*c* being driven on TSV connections 128*c*. When CA signals from base die 130*c* are blocked from being driven on TSV connections 128*c*, processor die control 126*c* may drive CA signals onto TSV connections 128*c*. From the foregoing, it should be understood that CA signals driven by CA buffers 122*c* or processor die control 126*c* onto TSV connections 128*c* are received by memory device 110*ac*, and memory device 110*bc*, via one or more of TSV connections 128*c*, TSV connections 118*ac*1-118*ac*2, and TSV connections 118*bc*1-118*bc*2.

Bidirectional DQ buffers 123*c* are operatively coupled to communicate DQ signals between TSV connections 129*c* and memory controller 155 via base die 130*c*. DQ buffers 123*c*, under the control of control signals 174*c*-175*c*, selectively drive DQ signals onto TSV connections 129*c*, and selectively drive the signals on TSV connections 129*c* to base die 130*c*. When DQ signals are not being driven on TSV connections 129*c*, processor element 125*c* (and/or processor die control 126*c*—not shown in FIG. 1C) may drive or receive DQ signals onto or from, respectively, TSV connections 129*c*. From the foregoing, it should be understood that DQ signals relayed by DQ buffers 123*c* onto or from TSV connections 129*c* are communicated with memory device 110*ac*, and memory device 110*bc*, via one or more of TSV connections 129*c*, TSV connections 119*ac*1-119*ac*2, and TSV connections 119*bc*1-119*bc*2.

Based on CA command information received by processor die control 126*c*, and snoop circuitry 127*c*, in particular, processor die control 126*c* may selectively isolate CA signals and DQ signals from memory devices 110*ac*-110*bc*. For example, in response to one or more mode register setting commands (e.g., a MRS command that memory devices 110*ac*-110*bc* do not respond to) on CA signals received from base die 130*c* that is detected by snoop circuitry 127*c*, processor die control 126*c* may use control signals 174*c*-176*c* to prevent CA signals from base die 130*c* and DQ signals from base die 130*c* from reaching TSV connections 128*c* and TSV connections 129*c*, respectively. In another example, in response to a timer, or an indicator from processor element 125*c*, processor die control 126*c* may use control signals 174*c*-176*c* to re-couple CA signals and DQ signals from base die 130*c* to TSV connections 128*c* and TSV connections 129*c*, respectively.

Figure 2A:
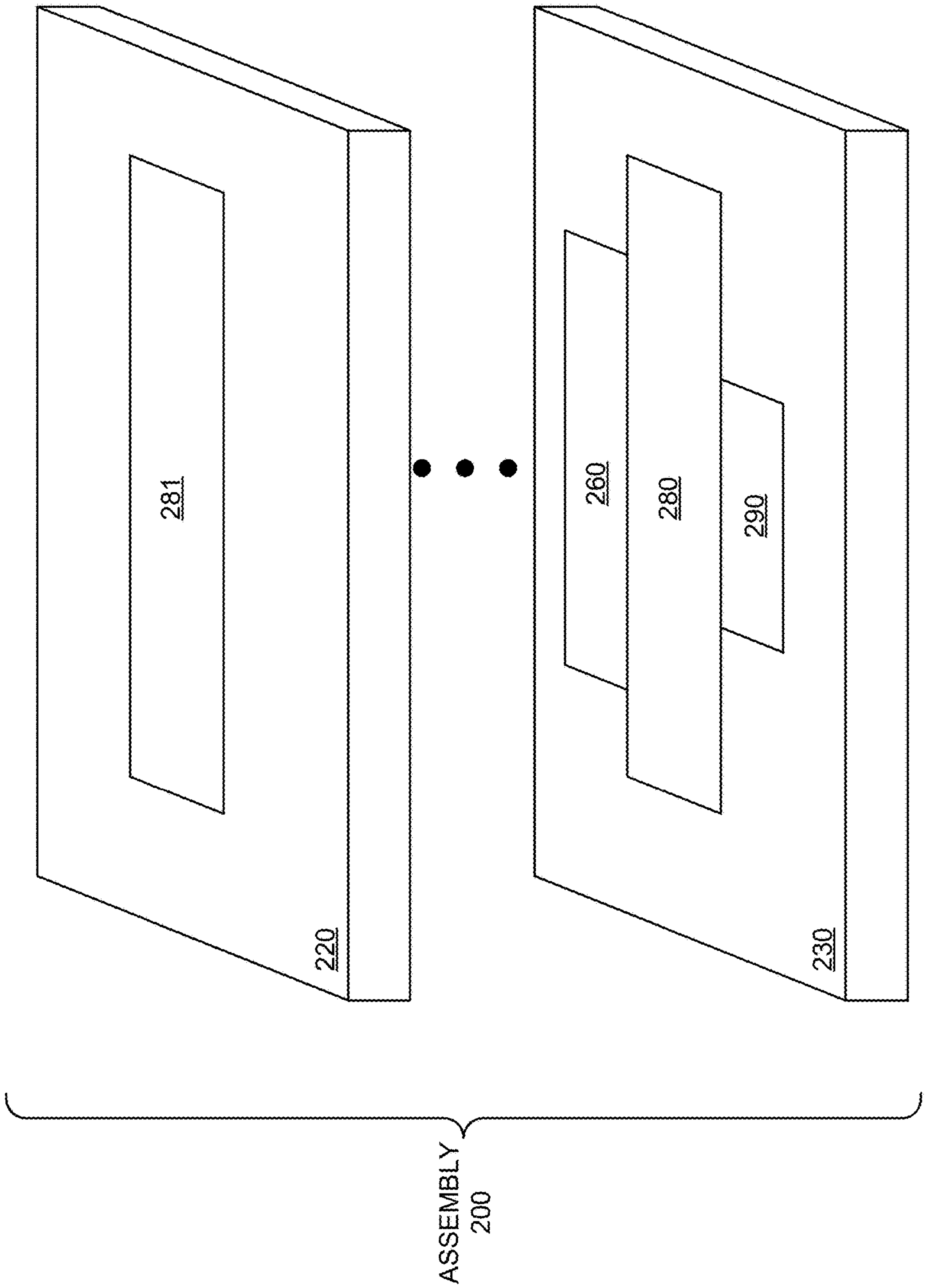
FIGS. 2A-2B are isometric illustrations of stacked die connection areas.
Figure 2B:
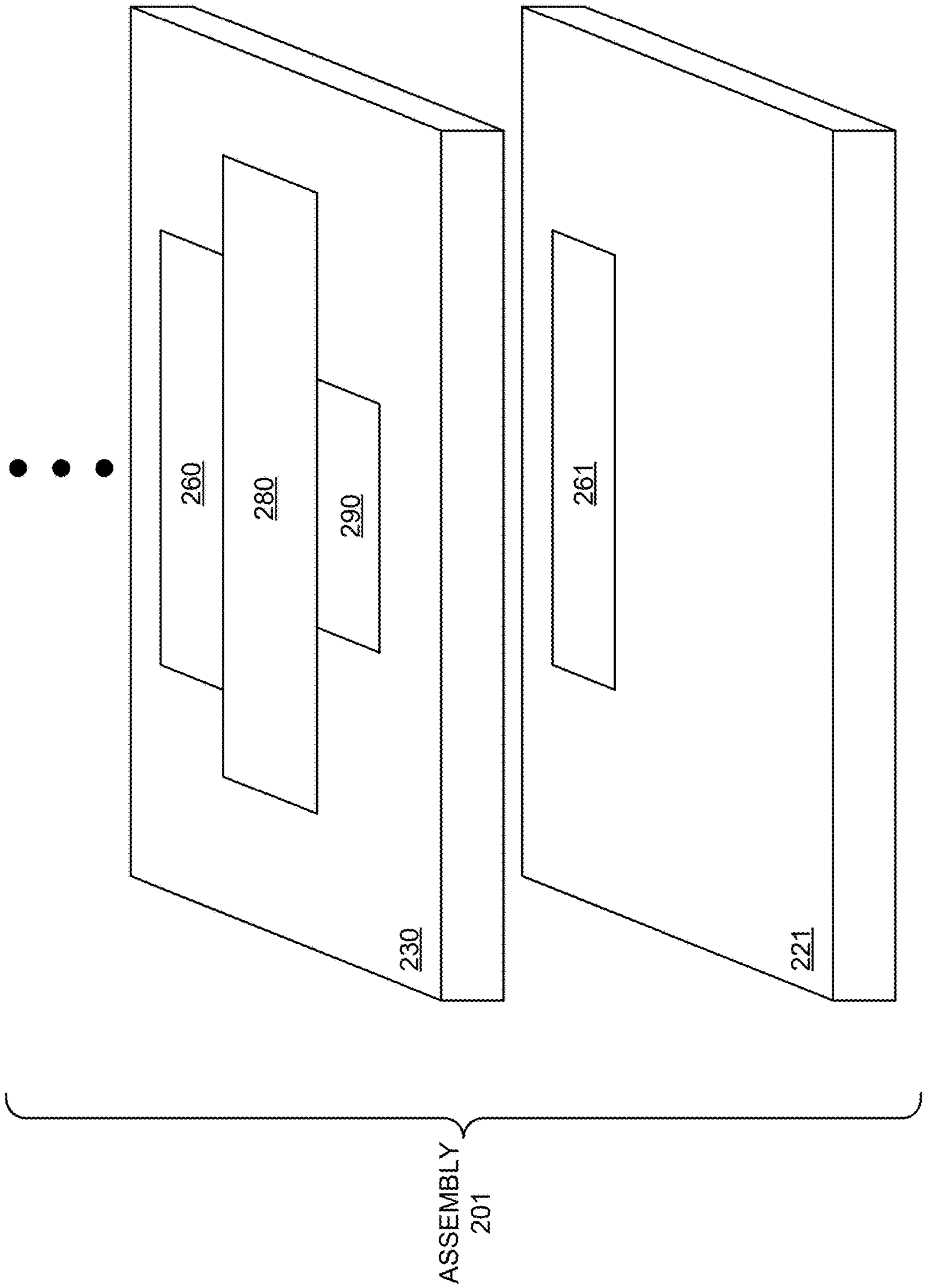

FIGS. 2A-2B are isometric illustrations of stacked die connection areas. In FIG. 2A, assembly 200 includes a base die 230 and one or more dies 220 stacked with base die 230. Base die 230 is the bottom die of the stack. Base die 230 includes external ballout area 260, internal TSV area 280, and direct access ballout area 290. Stacked die 220 includes internal TSV area 281. Internal TSV area 280 and internal TSV area 281 are aligned with each other so that signals may be propagated between the dies of assembly 200 using the TSVs of internal TSV areas 280-281. The internal TSV area 281 of die 220 is suitable for use by processor dies that are not the bottom die of the stack (e.g., processor die 120*a* and/or processor die 120*c*).

In FIG. 2B, assembly 201 includes a processor die 221, a base die 230, and one or more dies stacked on top of base die 230. Base die 230 is the second from the bottom die of the stack. Processor die 221 is the bottom die of the stack. Base die 230 includes external ballout area 260, internal TSV area 280, and direct access ballout area 290. Processor die 221 includes ballout area 261. Ballout area 260 and ballout area 261 are aligned with each other so that signals may be propagated between processor die 221 and base die 230 using a standardized ballout for base die 230. The ballout area 261 of processor die 221 is suitable for use by processor dies that are the bottom die of the stack (e.g., processor die 120*b*).

Figure 3A:
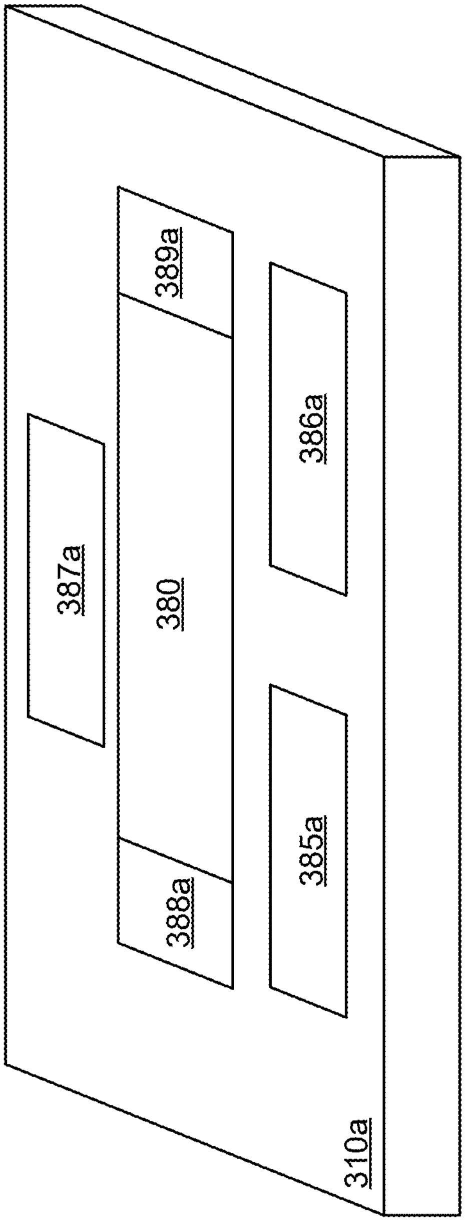
FIGS. 3A-3B are isometric illustrations of through-silicon via connection area assignments.
Figure 3B:
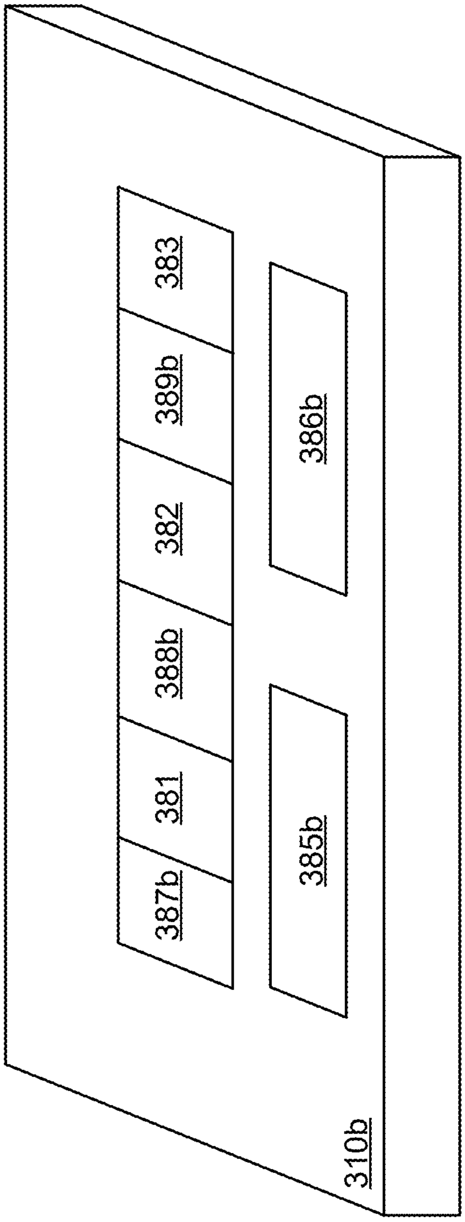

FIGS. 3A-3B are isometric illustrations of through-silicon via connection area assignments. FIG. 3A illustrates a first configuration for standardized/non-standardized TSV fields. In FIG. 3A, die 310*a* is intended to be included in a die stack. Die 310*a* includes standardized TSV area 380, and vendor specific TSV areas 385*a*-389*a*. Standardized TSV area 380 is standardized to allow usage of a same processor die across vendors and generations. Standardized TSV area 380 may include the same signals as an external ballout area (e.g., ballout area 260) and optionally additional power supply connections. Vendor specific TSV areas 385*a*-389*a* are not standardized and allow the inclusion of more power supply connections and vendor specified signals.

FIG. 3B illustrates a second configuration for standardized/non-standardized TSV fields. In FIG. 3B, die 310*b* is intended to be included in a die stack. Die 310*b* includes standardized TSV areas 381-383, and vendor specific TSV areas 385*b*-389*b*. Standardized TSV areas 381-383 are standardized to allow usage of a same processor die across vendors and generations. Standardized TSV areas 381-383 may include the same signals as an external ballout area (e.g., ballout area 260) and optionally additional power supply connections. Vendor specific TSV areas 385*b*-389*b* are not standardized and allow the inclusion of more power supply connections and vendor specified signals.

Figure 4:
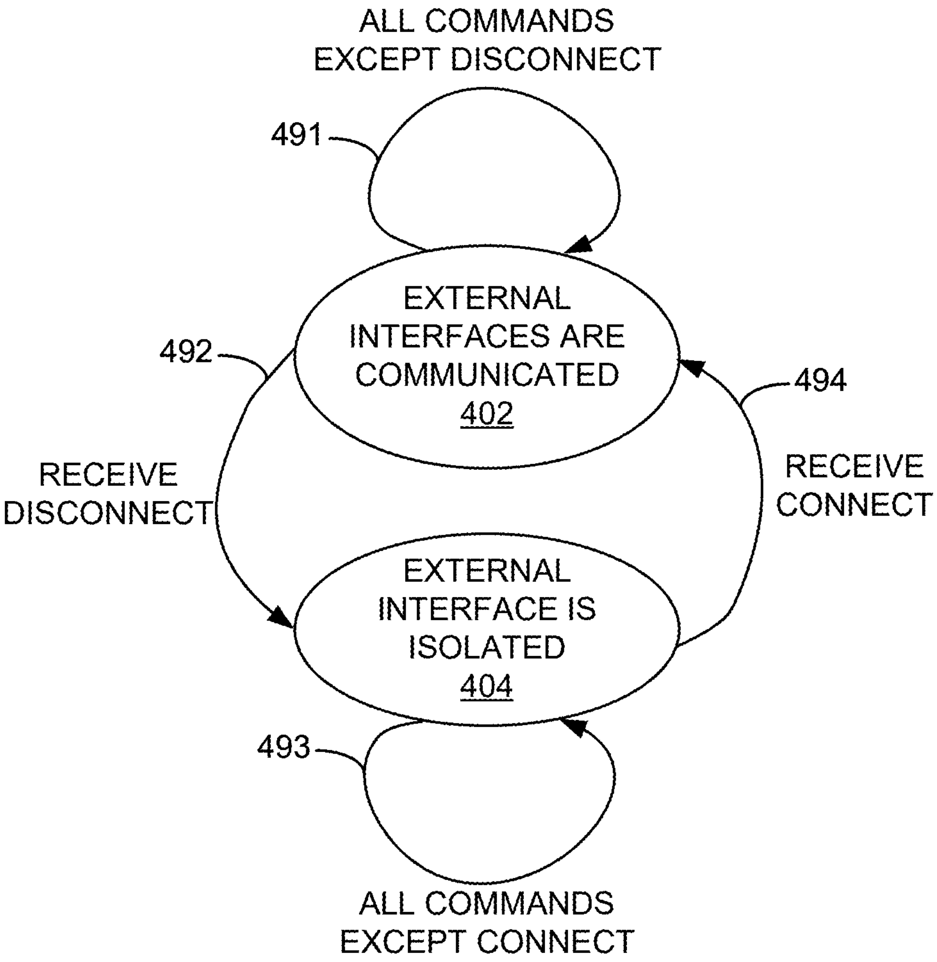
FIG. 4 is a state diagram for operating a base stacked die.

FIG. 4 is a state diagram for operating a base stacked die. One or more states/steps illustrated in FIG. 4 may be used by, for example, system 100, system 101, system 102 and/or their components. The state progression illustrated in FIG. 4 begins with the default or start-up state 402 where the signals of the external interfaces (e.g., CA signals 151 and DQ signals 152) are being communicated to the rest of the assembly (e.g., memory device 110*aa*, memory device 110*ba*, processor die 120*a*). In state 402, the base die waits for a disconnect command. This is illustrated in FIG. 4 by arrow 491. For example, base die 130*a* may wait in a normal operating mode for a disconnect command from processor die 120*a* communicated via side-channel TSV connections 137*a*.

When a disconnect command is received, the base die isolates the external interfaces from the device stack and proceeds to state 404. This is illustrated by arrow 492. In state 404, the base die prevents communication from the external interface to the devices in the stack. For example, base die 130*a* may prevent the signals of the external interfaces (e.g., CA signals 151 and DQ signals 152) from being communicated to the rest of the assembly (e.g., memory device 110*aa*, memory device 110*ba*, processor die 120*a*). In state 404, the base die waits for a connect command. This is illustrated in FIG. 4 by arrow 493. For example, base die 130*a* may wait in an isolation operating mode for a connect command from processor die 120*a* communicated via side-channel TSV connections 137*a*.

When a connect command is received, the base die re-couples the external interfaces to the device stack and proceeds to state 402. This is illustrated by arrow 494. As described herein, in state 402 where the signals of the external interfaces (e.g., CA signals 151 and DQ signals 152) are being communicated to the rest of the assembly (e.g., memory device 110*aa*, memory device 110*ba*, processor die 120*a*).

Figure 5:
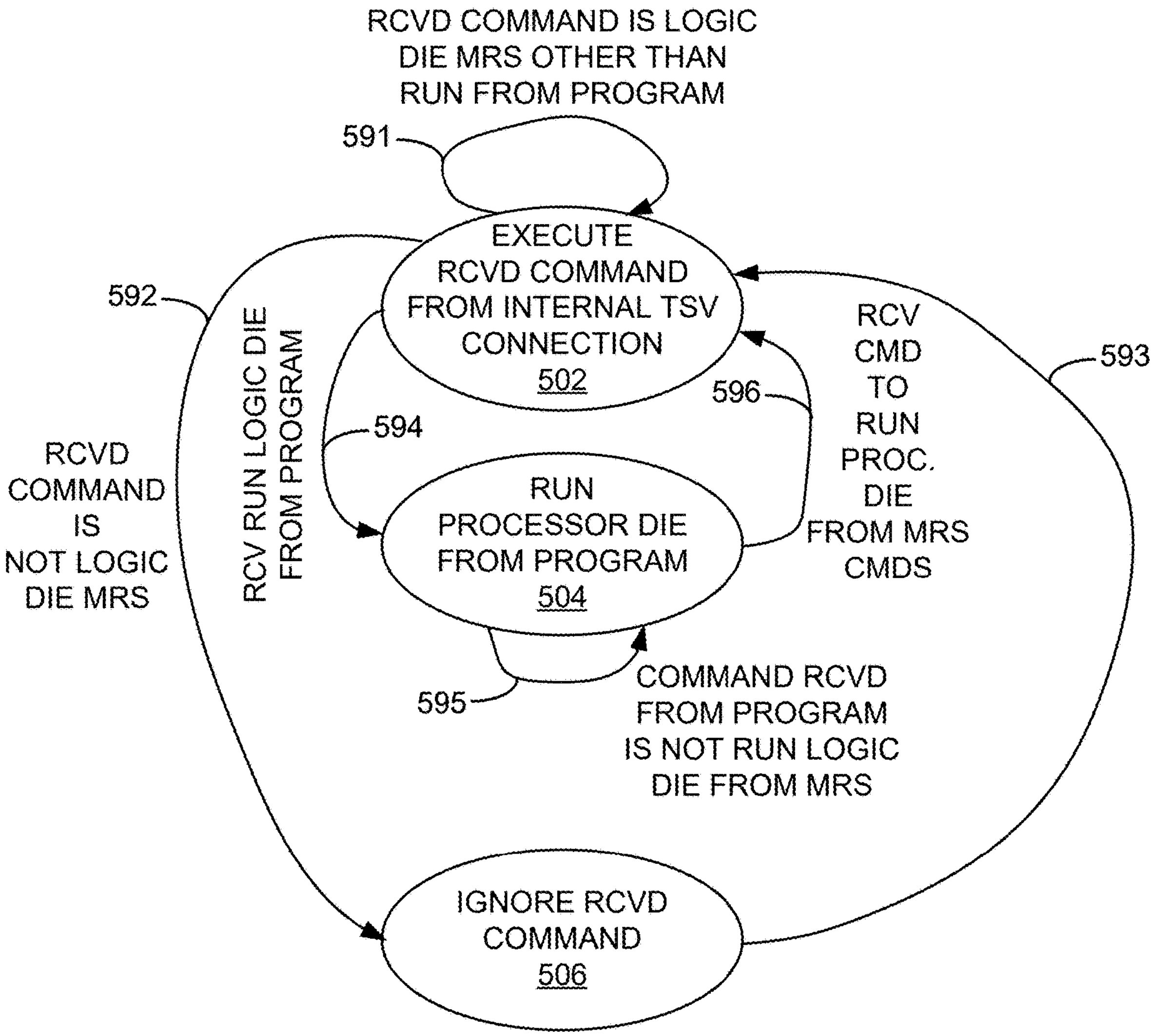
FIG. 5 is a state diagram for operating a processor stacked die.

FIG. 5 is a state diagram for operating a processor stacked die. One or more states/steps illustrated in FIG. 5 may be used by, for example, system 100, system 101, system 102 and/or their components. The state progression illustrated in FIG. 5 begins with the default or start-up state 502 where the processor die executes commands, when addressed to the processor die, that are received via internal TSV connections. In state 502, the processor die waits for a mode register set (MRS) command that corresponds to a "run from program" command. This is illustrated in FIG. 5 by arrow 591.

When a command is received that is not addressed to the processor die, the processor die proceeds to state 506. This is illustrated by arrow 592. In state 506, the processor die ignores the command and proceeds back to state 502. This is illustrated by arrow 593.

When the processor die receives a mode register set (MRS) command that corresponds to a "run from program" command, the processor die proceeds to state 504. This is illustrated in FIG. 5 by arrow 594. In state 504, the processor die runs a program. While running the program, the processor die waits for a program command instructing it to return to executing MRS commands directed to the processor die. This is illustrated in FIG. 5 by arrow 595.

When the processor die receives the program command instructing it to return to executing MRS commands directed to the processor die, processor die proceeds to state 502. This is illustrated in FIG. 5 by arrow 596. In an embodiment, the end of the execution of the program may constitute the command instructing the processor die to return to executing MRS commands directed to the processor die.

Figure 6:
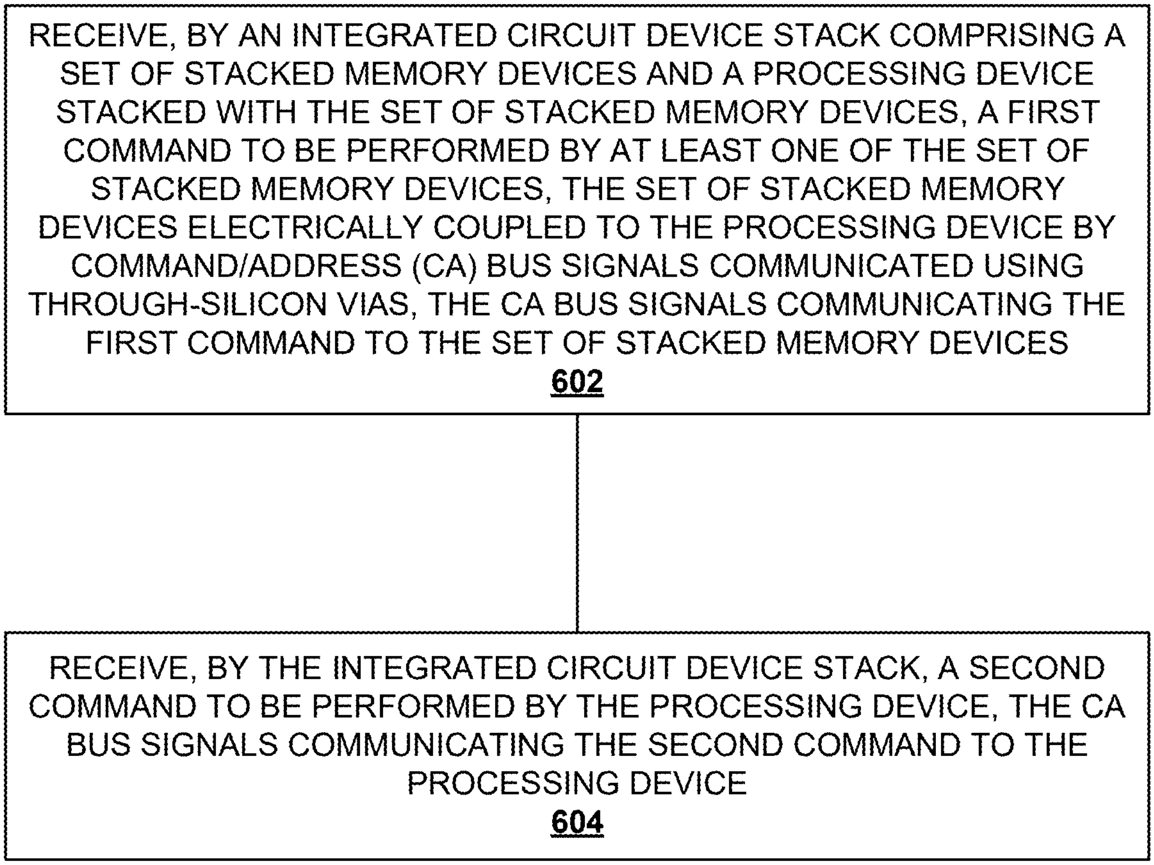
FIG. 6 is a flowchart illustrating a method of operating an integrated circuit die stack.

FIG. 6 is a flowchart illustrating a method of operating an integrated circuit die stack. One or more steps illustrated in FIG. 6 may be performed by, for example, system 100, system 101, system 102, and/or their components. By an integrated circuit device stack comprising a set of stacked memory devices and a process device stacked with the set of stacked memory device, a first command is received to be performed by at least one of the set of stacked memory device where the set of stacked memory device is electrically coupled to the processing device by command/address (CA) bus signals communicated using through-silicon vias, the CA bus signals communicating the first command to the set of stacked memory devices (602). For example, assembly 106 may receive, from memory controller 155, a first mode register set (MRS) command to be executed by memory device 110*aa* where the first MRS command is communicated to memory device 110*aa* via TSV connections 138*a* and TSV connections 118*aa*1.

By the integrated circuit device stack, a second command is received that is to be performed by the process device where the CA bus signals communicate the second command to the processing device (604). For example, assembly 106 may receive, from memory controller 155, a second mode register set (MRS) command to be executed by processor die 120*a* where the second MRS command is communicated to processor die 120*a* via TSV connections 138*a*, TSV connections 118*aa*1-118*aa*2, and TSV connections 118*ba*1-118*ba*2 and memory devices 110*aa*-110*ab* are configured to not respond to the second MRS command. In another example, additional commands and/or data in association with the second command may be received and/or transmitted by the processor die via data (DQ) bus signals (such as TSV connections 139*a*, TSV connections 119*aa*1-119*aa*2, and TSV connections 119*ba*1-119*ba*2).

Figure 7:
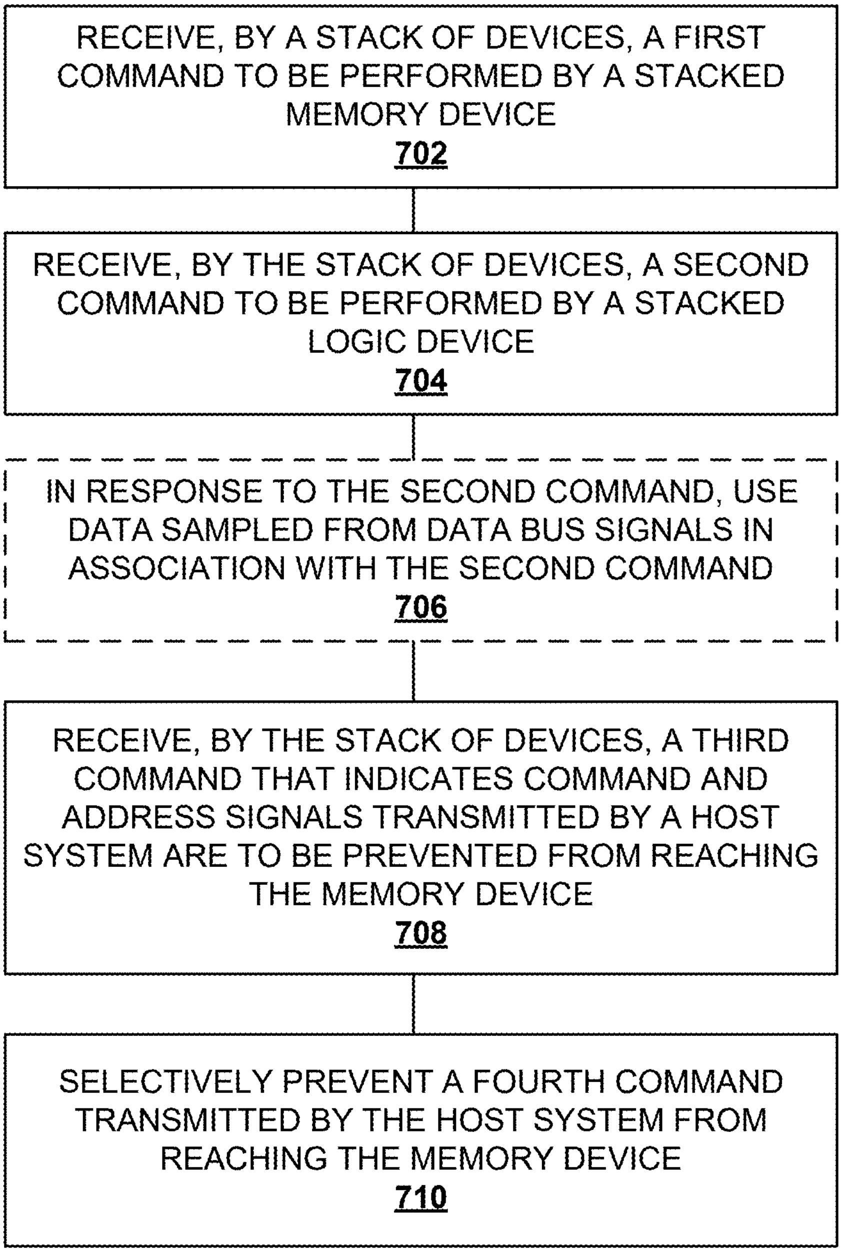
FIG. 7 is a flowchart illustrating a method of communicating among an integrated circuit die stack.

FIG. 7 is a flowchart illustrating a method of operating an integrated circuit die stack. One or more steps illustrated in FIG. 7 may be performed by, for example, system 100, system 101, system 102, and/or their components. By a stack of devices, a first command to be performed by a stacked memory device is received (702). For example, assembly 106 may receive, from memory controller 155, a read or a write command to be performed by memory device 110*aa* but is ignored by processor die 120*a*.

By the stack of devices, a second command to be performed by a stacked logic device is received (704). For example, assembly 106 may receive a first mode register set (MRS) command from memory controller 155 that is responded to by processor die 120*a* but is ignored by memory devices 110*aa*-110*ba*. Optionally, in response to the second command, data sampled from data bus signals in association with the second command is used (706). For example, processor die 120*a* may, in response to the first MRS command received from memory controller 155, use data sent by memory controller 155 via DQ signals 152 in association with the first MRS command to complete the first MRS command (and/or other commands and/or programs).

By the stack of devices, a third command that indicates command and address signals transmitted by a host system are to be prevented from reaching the memory device (708). For example, assembly 106 may receive a second mode register set (MRS) command from memory controller 155 that is responded to by processor die 120*a* but is ignored by memory devices 110*aa*-110*ba* where the second MRS command instructs processor die 120*a* to control base die 130*a* to prevent CA signals 151 and DQ signals 152 from being relayed by base die 130*a* to memory devices 110*aa*-110*ab*.

A fourth command transmitted by the host system is selectively prevented from reaching the memory device (710). For example, a no-operation (NOP) command transmitted by memory controller 155 on CA signals 151 may be prevented by base die 130*a* from reaching memory devices 110*aa*-110*ab*.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of system 100, system 101, system 102, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3-½ inch floppy media, CDs, DVDs, and so on.

Figure 8:
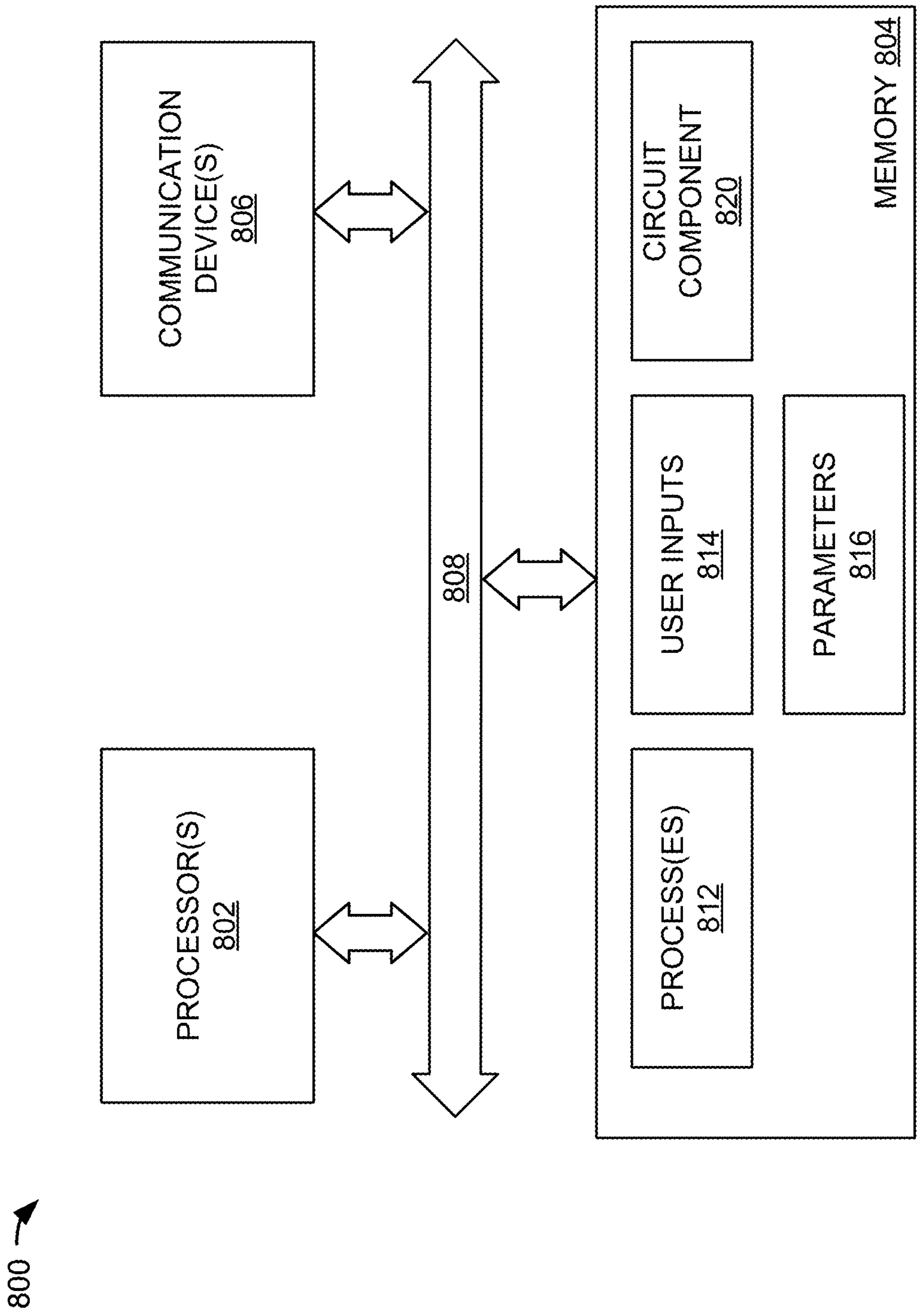
FIG. 8 is a block diagram of a processing system.

FIG. 8 is a block diagram illustrating one embodiment of a processing system 800 for including, processing, or generating, a representation of a circuit component 820. Processing system 800 includes one or more processors 802, a memory 804, and one or more communications devices 806. Processors 802, memory 804, and communications devices 806 communicate using any suitable type, number, and/or configuration of wired and/or wireless connections 808.

Processors 802 execute instructions of one or more processes 812 stored in a memory 804 to process and/or generate circuit component 820 responsive to user inputs 814 and parameters 816. Processes 812 may be any suitable electronic design automation (EDA) tool or portion thereof used to design, simulate, analyze, and/or verify electronic circuitry and/or generate photomasks for electronic circuitry. Representation 820 includes data that describes all or portions of system 100, system 101, system 102, and their components, as shown in the Figures.

Representation 820 may include one or more of behavioral, register transfer, logic component, transistor, and layout geometry-level descriptions. Moreover, representation 820 may be stored on storage media or communicated by carrier waves.

Data formats in which representation 820 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email.

User inputs 814 may comprise input parameters from a keyboard, mouse, voice recognition interface, microphone and speakers, graphical display, touch screen, or other type of user interface device. This user interface may be distributed among multiple interface devices. Parameters 816 may include specifications and/or characteristics that are input to help define representation 820. For example, parameters 816 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 804 includes any suitable type, number, and/or configuration of non-transitory computer-readable storage media that stores processes 812, user inputs 814, parameters 816, and circuit component 820.

Communications devices 806 include any suitable type, number, and/or configuration of wired and/or wireless devices that transmit information from processing system 800 to another processing or storage system (not shown) and/or receive information from another processing or storage system (not shown). For example, communications devices 806 may transmit circuit component 820 to another system. Communications devices 806 may receive processes 812, user inputs 814, parameters 816, and/or circuit component 820 and cause processes 812, user inputs 814, parameters 816, and/or circuit component 820 to be stored in memory 804.

Implementations discussed herein include, but are not limited to, the following examples:

Example 1: An integrated circuit stack, comprising: an external command/address (CA) interface to receive commands and addresses from a device external to the integrated circuit stack; a set of stacked memory devices comprising memory cell circuitry, the set of stacked memory devices to receive, via a memory device CA interface, commands and addresses received by the integrated circuit stack via the CA interface; and, a processing device electrically coupled to, and stacked with, the set of stacked memory device to form a first device stack, the first processing device comprising at least one processing element, the first processing device to receive, via a processing device CA interface, the commands and addresses received by the integrated circuit stack via the CA interface, the first processing device to, in response to a first mode setting command received via the processing device CA interface, determine whether the first mode setting command is directed to the processing device.

Example 2: The integrated circuit stack of example 1, wherein the processing device is to further determine whether the first mode setting command is directed to at least one of the set of stacked memory devices.

Example 3: The integrated circuit stack of example 1, wherein a coupling of the external CA interface to the memory device CA interface is selectively enabled and disabled.

Example 4: The integrated circuit stack of example 3, wherein when the memory device CA interface is coupling the external CA interface to the memory device and the CA interface is disabled, the processing device executes a program stored by the integrated circuit stack.

Example 5: The integrated circuit stack of example 3, wherein the set of stacked memory devices are accessed via through-silicon vias communicating signals among devices of the first device stack.

Example 6: The integrated circuit stack of example 1, wherein, in response to a second mode setting command received via the processing device CA interface that is determined to be directed to the processing device, the processing device is to sample a processing device data interface.

Example 7: The integrated circuit stack of example 1, wherein the first mode setting command is determined to be directed to the processing device based on the set of stacked memory devices being configured to not respond to the first mode setting command.

Example 8: An assembly, comprising: a set of stacked memory devices each comprising at least one memory array, the at least one memory array to be accessed via signals of an external interface; and, a set of one or more processing devices electrically coupled to, and stacked with, the set of stacked memory devices, the set of one or more processing devices to be accessed via the external interface, the external interface to receive a first mode setting command and a second mode setting command, the first mode setting command to be directed to at least one memory device of the set of stacked memory devices, the second mode setting command to be directed to at least one processing device of the set of one or more processing devices.

Example 9: The assembly of example 8, further comprising: circuitry to selectively prevent signals of the external interface from reaching the set of stacked memory devices.

Example 10: The assembly of example 9, wherein at least one processing device of the set of one or more processing devices is to access at least one at least one memory device of the set of stacked memory devices while the signals of the external interface are being prevented from reaching the set of stacked memory devices.

Example 11: The assembly of example 10, wherein at least one processing device of the set of one or more processing devices is to access at least one memory device of the set of stacked memory devices while the signals of the external interface are being prevented from reaching the set of stacked memory devices to access instructions to be executed by the at least one processing device.

Example 12: The assembly of example 10, wherein at least one processing device of the set of one or more processing devices is to access at least one memory device of the set of stacked memory devices while the signals of the external interface are being prevented from reaching the set of stacked memory devices as a result of instructions executed by the at least one processing device that are stored by the at least one processing device.

Example 13: The assembly of example 8, wherein the set of stacked memory devices and the set of one or more processing devices are electrically coupled using through-silicon vias (TSVs).

Example 14: The assembly of example 13, wherein the external interface is to be, in a first mode, controlled by a host, and in a second mode, controlled by the set of one or more processing devices.

Example 15: A method, comprising: receiving, by an integrated circuit device stack comprising a set of stacked memory devices and a processing device stacked with the set of stacked memory devices, a first command to be performed by at least one of the set of stacked memory devices, the set of stacked memory devices electrically coupled to the processing device by command/address (CA) bus signals communicated using through-silicon vias, the CA bus signals communicating the first command to the set of stacked memory devices; and, receiving, by the integrated circuit device stack, a second command to be performed by the processing device, the CA bus signals communicating the second command to the processing device.

Example 16: The method of example 15, wherein the first command determines a first mode of at least one of the set of stacked memory devices.

Example 17: The method of example 16, wherein the set of stacked memory devices are configured to ignore the second command.

Example 18: The method of example 15, wherein the set of stacked memory devices is electrically coupled to the processing device by data bus signals communicated using through-silicon vias, and the method further comprises: in response to the second command, using data sampled from the data bus signals in association with the second command.

Example 19: The method of example 15, further comprising: receiving, by the integrated circuit device stack, a third command, communicated by the CA bus signals, that indicates commands and address signals transmitted by a host system are to be prevented from reaching the set of stacked memory devices.

Example 20: The method of example 19, further comprising: selectively preventing a fourth command that is transmitted by the host system from reaching the set of stacked memory devices.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A base die integrated circuit (IC) chip, comprising:

a command/address (CA) interface to receive first CA information and second CA information;

a device stack interface to electrically couple to a processing device IC and a set of stacked memory devices comprising memory cell circuitry, the device stack interface to provide the first CA information to the set of stacked memory devices and to the processing device IC, wherein the processing device IC includes at least one processing element; and the base die IC chip to, in response to a first signal from the processing device IC that was based on the first CA information, isolate the set of stacked memory devices from the second CA information.

2. The base die IC chip of claim 1, wherein the CA interface is to receive third CA information and the base die IC chip is to, in response to a second signal from the processing device IC, provide the set of stacked memory devices with the third CA information.

3. The base die IC chip of claim 2, wherein the second signal from the processing device IC is based on an end of an execution of a program running on the processing device IC.

4. The base die IC chip of claim 1, wherein the CA interface is to receive third CA information and the base die IC chip is to, in response to a timer, provide the set of stacked memory devices the third CA information.

5. The base die IC chip of claim 2, further comprising:

a data (DQ) interface to communicate first DQ information and second DQ information.

6. The base die IC chip of claim 5, wherein the base die IC chip is to, in response to the first signal from the processing device IC that was based on the first CA information, prevent communication of the second DQ information with the stacked memory devices.

7. The base die IC chip of claim 6, wherein the DQ interface is to receive third DQ information and the base die IC chip is to, in response to the second signal from the processing device IC, provide the set of stacked memory devices with the third DQ information.

8. The base die IC chip of claim 7, wherein the base die IC chip is to receive fourth DQ information from the set of stacked memory devices, and the base die IC is to, in response to the second signal from the processing device IC, transmit the fourth DQ information via the DQ interface.

9. An integrated circuit (IC), comprising:

a memory device stack interface to couple with a set of stacked memory devices each respectively comprising at least one memory array and a memory device command/address (CA) interface;

a processing device IC interface to couple with a processing device IC comprising at least one processing element;

a command/address (CA) interface to receive first CA information and second CA information; and isolation circuitry to, in response to a first signal from the processing device IC that was based on the first CA information, prevent the memory device stack interface from transmitting the second CA information via the memory device stack interface.

10. The integrated circuit of claim 9, wherein the CA interface is to receive third CA information and the isolation circuitry is to, in response to a second signal from the processing device IC, transmit the third CA information via the memory device stack interface.

11. The integrated circuit of claim 10, wherein the second signal from the processing device IC is based on an end of an execution of a program running on processing device IC.

12. The integrated circuit of claim 9, wherein the CA interface is to receive third CA information and the isolation circuitry is to, based on a timer, transmit the third CA information via the memory device stack interface.

13. The integrated circuit of claim 10, further comprising:

a data (DQ) interface to communicate first DQ information and second DQ information.

14. The integrated circuit of claim 13, wherein the isolation circuitry is to, in response to the first signal from the processing device IC that was based on the first CA information, prevent communication of the second DQ information via the memory device stack interface.

15. The integrated circuit of claim 14, wherein the DQ interface is to receive third DQ information and the isolation circuitry is to, in response to the second signal from the processing device IC, provide the set of stacked memory devices with the third DQ information.

16. The integrated circuit of claim 15, wherein the integrated circuit is to receive fourth DQ information from the set of stacked memory devices via the memory device stack interface, and the isolation circuitry is to, in response to the second signal from the processing device IC, transmit the fourth DQ information via the DQ interface.

17. A method of operation of a base die integrated circuit (IC) stacked with a set of stacked memory devices and a processing device IC that includes at least one processing element, the method comprising:

receiving, via a command/address (CA) interface of the base die integrated circuit (IC), first CA information and second CA information;

in response to a first signal from the processing device IC, providing the first CA information to the set of stacked memory devices and to the processing device IC; and in response to a second signal from the processing device IC that was based on the first CA information, isolating the set of stacked memory devices from the second CA information.

18. The method of claim 17, further comprising:

receiving, via the CA interface, third CA information; and in response to a third signal from the processing device IC, providing the set of stacked memory devices with the third CA information.

19. The method of claim 17, further comprising:

communicating, via a data (DQ) interface of the base die IC, first DQ information and second DQ information.

20. The method of claim 19, further comprising:

in response to the first signal from the processing device IC, communicating the first DQ information with the set of stacked memory devices; and in response to the second signal from the processing device IC, preventing communication of the second DQ information via the base die IC.

* * * * *